United States Patent [19]

Okabe et al.

[11] Patent Number: 5,155,094
[45] Date of Patent: Oct. 13, 1992

[54] TUNNELING JOSEPHSON ELEMENT WITH A BLOCKING LAYER INERT TO OXYGEN

[75] Inventors: Yoichi Okabe; Atsuki Inoue; Hideomi Koinuma, all of Tokyo, Japan

[73] Assignee: The University of Tokyo, Tokyo, Japan

[21] Appl. No.: 174,760

[22] Filed: Mar. 29, 1988

[30] Foreign Application Priority Data

Jul. 28, 1987 [JP] Japan .............................. 62-186751

[51] Int. Cl.$^5$ ...................... H01B 12/00; H01L 39/12
[52] U.S. Cl. ........................................ 505/1; 505/700; 505/701; 505/702; 505/780; 357/5
[58] Field of Search ..................... 357/5; 505/700, 701, 505/702, 780, 1

[56] References Cited

U.S. PATENT DOCUMENTS

| | | | |
|---|---|---|---|
| 4,316,785 | 2/1982 | Suzuki et al. | 357/5 |
| 4,495,510 | 1/1985 | Roth et al. | 357/4 |
| 4,929,596 | 5/1990 | Meyer et al. | 505/1 |
| 4,952,554 | 8/1990 | Jin et al. | 505/1 |

FOREIGN PATENT DOCUMENTS

| | | | |
|---|---|---|---|
| 60-65581 | 4/1985 | Japan | 357/5 |
| 60-198874 | 10/1985 | Japan | 357/5 |

OTHER PUBLICATIONS

Applied Physics Letters, vol. 51, No. 3, Jul. 20, 1987, "High Tc Superconductors—composite wire fabrication", Jin et al., pp. 203-204.

Japanese Journal of Applied Physics, vol. 26, No. 5, May 1987, pp. L645-L646; I. Iguchi et al.: "Tunneling spectroscopy of Y-Ba-Cu-O compound".

Japanese Journal of Applied Physics, vol. 26, No. 6, Jun. 1987, pp. L1017-L1018; K. Takeuchi et al.: "Electrical properties of La-Sr-Cu-O/Al contact".

Extended Abstracts of the M.R.S.-High Temperature superconductors, Proceedings of Symposiums, 1987 Spring meeting of Materials Research Society, Anaheim, Apr. 23rd-24th, 1987, pp. 169-171, Materials Research Society, Pittsburg, US; R. H. Hammond et al.: "Superconducting thin films of the perovskite superconductors by electron-beam deposition".

Japanese Journal of Applied Physics, vol. 26, No. 9, Sep. 1987, pp. L1443-L1444, A. Inoue et al.: "Y-Ba-Cu-O/Nb tunnel type Josephson junctions".

*Primary Examiner*—Rolf Hille
*Assistant Examiner*—Steven Loke
*Attorney, Agent, or Firm*—Sughrue, Mion, Zinn, Macpeak & Seas

[57] ABSTRACT

A superconductive device and method for the manufacture thereof is disclosed, having a tunneling Josephson element comprising a first oxide superconductor electrode, a blocking layer consisting of a metal substantially inert to oxygen formed on the surface of the oxide superconductor, an insulating thin film layer formed on the blocking layer, and a second superconductor electrode opposing said first electrode formed on the insulating thin film.

3 Claims, 5 Drawing Sheets

FIG_1
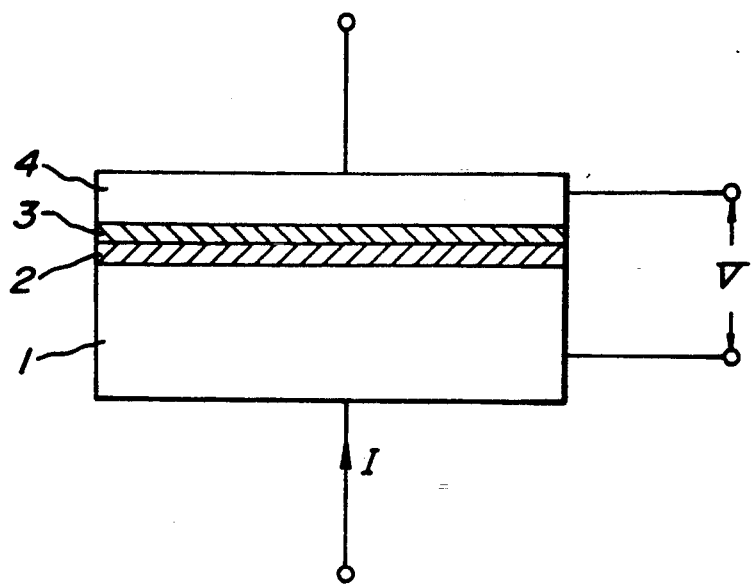
FIG_2
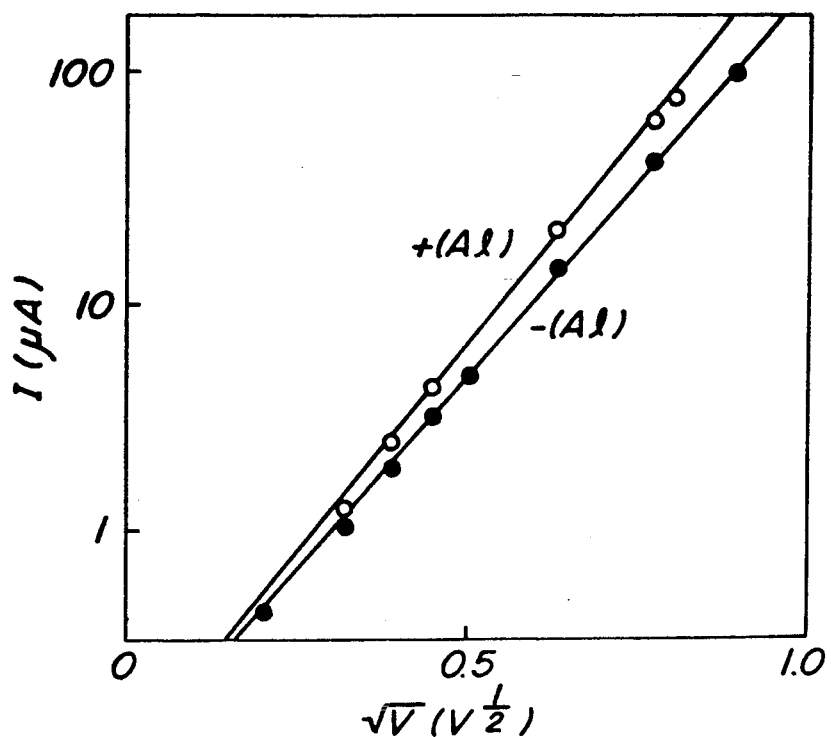

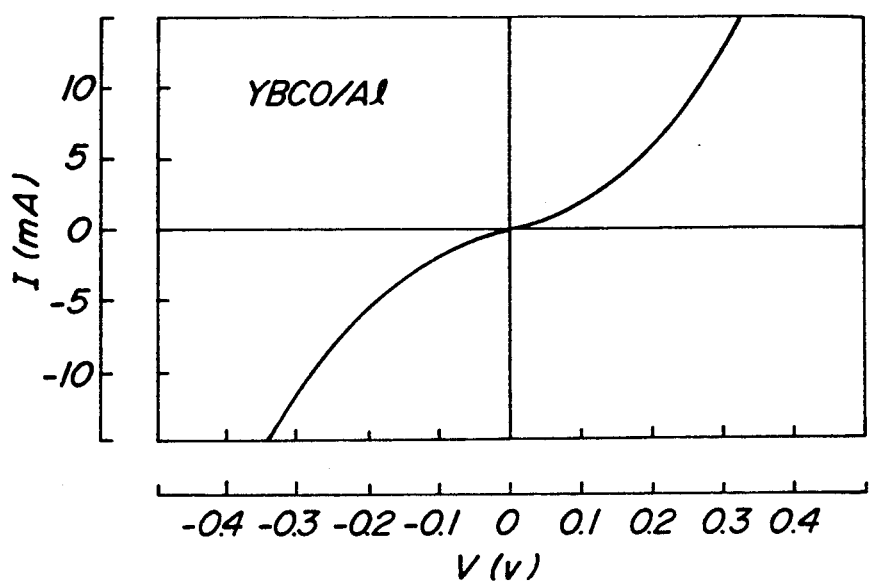
FIG_3
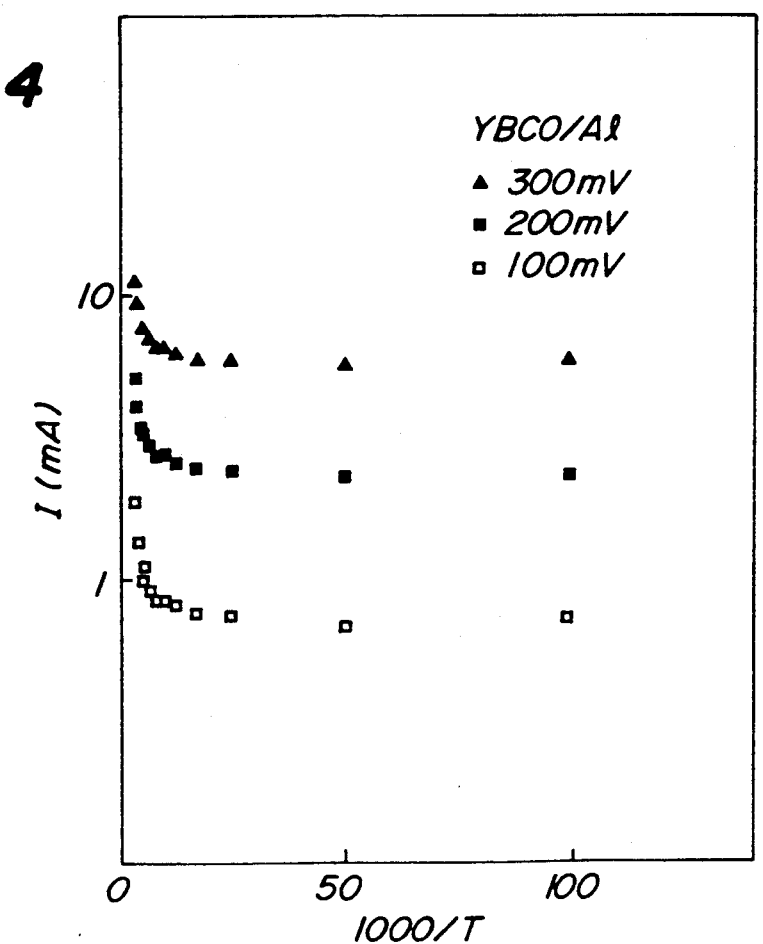
FIG_4

FIG_6a
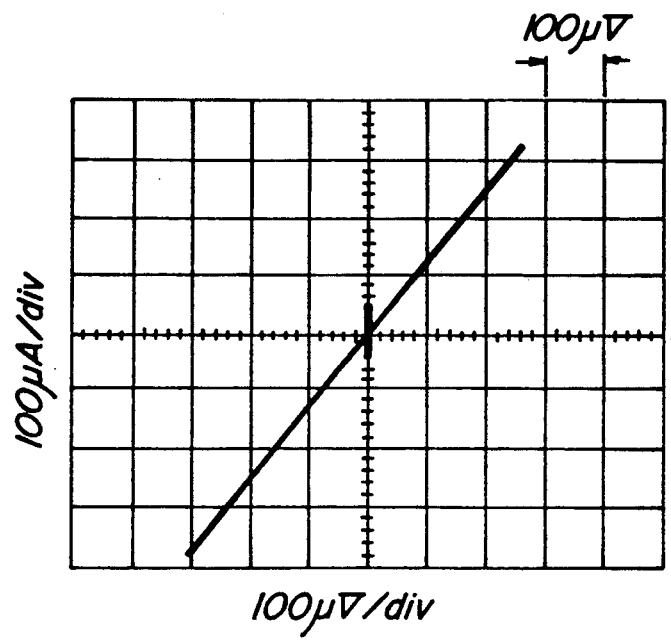
FIG_6b
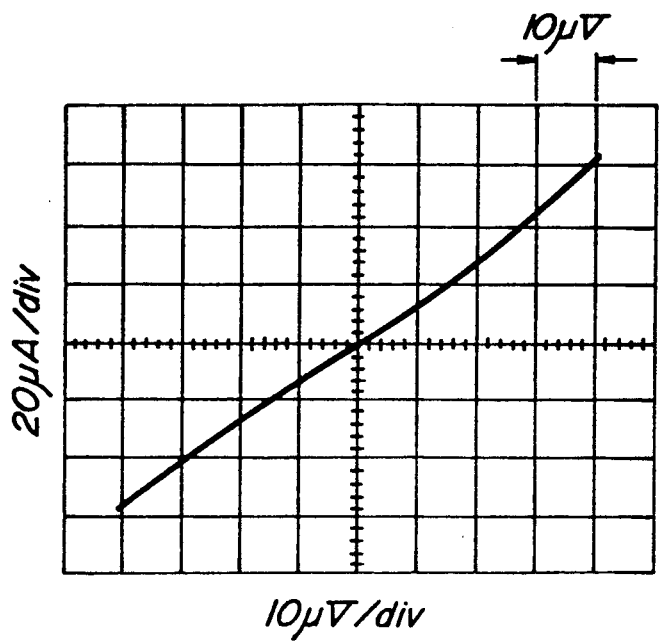

TUNNELING JOSEPHSON ELEMENT WITH A BLOCKING LAYER INERT TO OXYGEN

BACKGROUND OF THE INVENTION

1. Field of the Invention

The present invention relates to a technique of forming a device with the aid of a superconductive phenomenon, particularly a technique of forming a tunneling Josephson element.

2. Related Art Statement

There has been tried to form a solid electron device such as a Josephson element with the use of a well-known superconductor such as lead, niobium, an alloy or compound thereof as electrode material. The Josephson element with the use of these metallic superconductors is near practice use as a result of studies for last ten-odd years.

However, the critical temperature Tc of these superconductors is extremely low absolute temperature of 23K in case of $Nb_3Ge$ at the highest, so that in order to actuate the element, it is necessary to use liquid helium. The use of liquid helium is a great obstacle for widely using a Josephson element in general. Further, an essential speed of the superconductive device is limited by an energy gap inherent to the superconductor. This energy gap is pointed out to be theoretically propertionate to the critical temperature. Therefore, the low critical temperature limits a limit speed of the superconductive device.

It has recently become clarified that the noted oxide superconductor such as Y-Ba-Cu-O series is operable at a relative high temperature (more than 90K) and that the oxide superconductor has a large superconductive gap voltage ten times larger than the prior superconductor. In the above two points, the Josephson element with the use of these materials, as compared with the prior devices, is very charming and considered to be industrially valuable in practice. However, when the insulator as a tunnel barrier is deposited, these superconducting oxides are liable to cause a reaction at the interface between the insulator and superconducting oxides. Therefore, the superconducting characteristic on the side of the superconductor is remarkably deteriorated and becomes a large obstacle in manufacture of a device. This is confirmed to be caused due to the structure of the oxide superconductor which is liable to dissociate oxygen and to take place a chemical reaction of atoms in the insulator with oxygen in the superconductor.

SUMMARY OF THE INVENTION

The present invention aims to improve the interface characteristics between an insulator and a oxide superconductor, and to propose a method of manufacturing a tunneling Josephson element by depositing metal which is hard to react with oxygen on the surface of the oxide superconductor.

An object of the invention is to provide a superconductive device having a tunneling Josephson element comprising an oxide superconductor substrate, a blocking layer formed on the surface of the oxide superconductor substrate by coating a metal hardly to bond with oxygen, an insulating thin film layer formed on the blocking layer, and the other side superconductor electrode coated on the insulating thin film.

Another object of the invention is to provide a method of manufacturing a superconducting device comprising the steps of forming a blocking layer by polishing the surface of an oxide superconductor substrate to a mirror surface, coating a metal hardly to bond with oxygen selected from group consisting of Au, Pt, Ag and Cu onto said substrate, and forming an insulating thin film selected from the group consisting of oxide, fluoride and semiconductor on the surface of the blocking layer, and forming a superconductor as the other side electrode on the surface of the insulating thin film, thereby constructing a tunneling Josephson element between the oxide superconductor substrate and the other side superconducting electrode.

BRIEF DESCRIPTION OF THE DRAWINGS

For a better understanding of the invention, reference is made to the accompany drawings, in which:

FIG. 1 is a cross-sectional view of a Josephson element formed by a method according to the invention;

FIG. 2 is an I-V characteristic view of junction of La-Sr-Cu-0 oxide superconductor and Al at room temperature;

FIG. 3 is an I-V characteristic view of the obtained ohmic contact at room temperature (T=296K);

FIG. 4 is a characteristic view showing temperature dependency of a current of YBCO/Al junction;

FIG. 6a-b is an I-V characteristic view of YBCO/Au/AlO$_x$/Nb tunneling junction at 4.2K according to the invention.

DESCRIPTION OF THE PREFERRED EMBODIMENTS

Figure 5A:
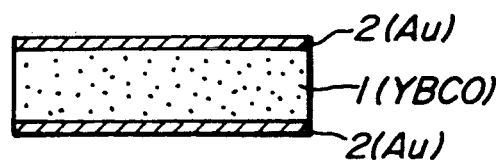
FIG. 5a-d is a manufacturing step of YBCO/Au/AlO$_x$/Nb tunneling Josephson junction according to the invention.
Figure 5B:
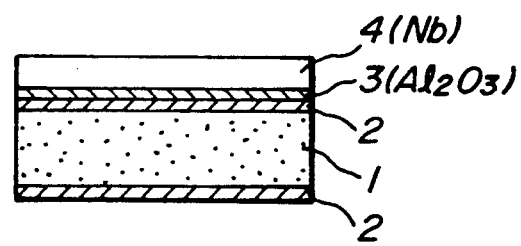
Figure 5C:
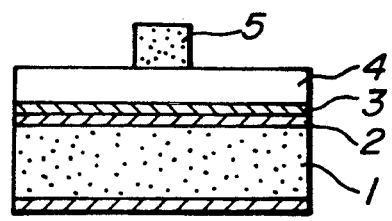
Figure 5D:
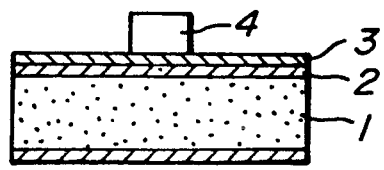

A principle of the invention is to manufacture a tunneling Josephson element by preventing a reaction between an insulator film and a superconducting oxide by depositing a blocking layer consisting of a metal inert to react with oxygen on the surface of the oxide superconductor before forming the insulator thin film on the surface of the oxide superconductor, and this principle can be applied to any oxide superconductor regardless of its kind. It means that the oxide superconductor has a structure of easily dissociating oxygen, and this oxide superconductor is coated with a metal inert to react with oxygen to form a blocking layer for inactivity.

As oxides superconductor, use may be made of any superconductor material obtained by using a sintering method, screen printing method, sputtering method, MBE method, CVD method (inclusive of MOCVD method) and the like. As an example of materials

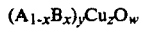

where, $x=0\sim1$, $y=2\sim4$ (preferably $y=3$), $z=1\sim4$ (preferably $z=2\sim3$), and $w=4\sim10$ (preferably a vicinity of 7).

However, instead of 0 (oxygen), halogen elements such as F, Cl and the like may be used. As an element A, it is selected from the group consisting of yttrium (Y), gadolinium (Gd), Ytterbium (Yb), Europium (Eu), Terbium (Tb), Dysprosium (Dy), Holmium (Ho), Erbium (Er), Thulium (Tm), Lutetium (Lu), Scandium (Sc) and other elements of Periodic Table IIIa. As an element B, it is selected from the group consisting of Radium (Ra), Barium (Ba), Strontium (Sr), Calcium (Ca), Magnesium (Mg), Beryllium (Be) of Periodic Table IIa.

Particularly, as an embodiment, $Y_1Ba_2Cu_3O_7$ is used. Further, as an element A, use may be made of lanthanide element and actinide element besides the above elements.

As insulators, it is selected from the group consisting of aluminum oxide, tantalum oxide, titanium oxide, zirconium oxide, magnesium oxide, molybdenum oxide, silicon oxide, copper oxide and silver oxide. Use may also be made of metal oxide or metal fluoride selected from the group consisting of calcium fluoride, zirconium fluoride, aluminum fluoride and magnesium fluoride and a semiconductor selected from Silicon (Si) and Germanium (Ge). These oxides can be formed by a method selected from sputtering method, deposition method, CVD method, MBE method and the like, and also formed by forming a metal atom into a film by the above method, and thereafter making the film into oxide by using a method such as thermal oxidation, plasma oxidation, anode oxidation in a solution and the like. Fluoride can be formed on fluoride itself in the same manner or after filming the metal atom, it is converted into a compound with fluorine or gas including fluorine such as $CF_4$ and the like.

As a blocking layer, use may be made of stable metals selected from the group consisting of Au, Pt, Ag, Cu and the like which is comparatively hard to form oxide. Both the blocking layer and the insulating film are formed into about 10~100 Å in the thickness.

A Josephson junction can be formed by depositing other superconductor material on the upper portion of the insulating film. In this case, as the upper superconductor material, use may be made of other metal superconductors (Nb, Pb and compound and alloy thereof) other than the above oxide superconductor.

An embodiment of the invention is shown in the accompanying drawings.

In FIG. 1, 1 is an Y-Ba-Cu-0 series oxide superconductor, 2 is a blocking layer of Gold (Au) and the like coated on the surface of the oxide superconductor, 3 is an insulating layer such as $Al_2O_3$ coated on the surface of said blocking layer, and 4 is an upper electrode such as Nb coated on the surface of said insulating thin film layer.

As shown in one embodiment of the detailed construction in FIG. 1, an interface reaction of the insulator with the superconductor can be prevented by coating the surface of the oxide superconductor with a blocking layer of Gold (Au) and the like, and a Josephson junction can be constructed without lowering superconducting characteristic on the side of the superconductor. As a result, it becomes possible to observe a superconducting current flowed between both the superconductor electrodes. Further, a constant voltage step (shappiro step) on a current-voltage characteristic is generated by radiating microwaves, and a Josephson effect of this junction can be confirmed.

In case of forming a Josephson element by drawing another superconductor 4 near onto an oxide superconductor 1 through a thin insulating film 3, if the insulating film 3 is directly deposited on the oxide superconductor 1, the characteristic of the superconductor electrode is considerably deteriorated by reaction of the insulating film 3 with the oxide superconductor 1 as an electrode material so as to observe no superconductor current flow, and a resistance between both the electrodes becomes high.

On the other hand, if a coating layer 2 is formed on the surface of the oxide superconductor 1 with the use of a hard-to-oxidizing metal such as Au and the like before deposition of an insulating film and thereafter the insulating film 3 is deposited thereon, it is possible to prevent a direct reaction of the oxide superconductor 1 with the insulating film 3, so that a tunneling Josephson element can be composed without deteriorating the superconducting characteristic of the superconducting electrode.

According to the invention, on the surface of the oxide superconductor is formed a blocking layer by coating a stable metal element such as Au, Pt, Ag, Cu and the like which is hard to bond with oxygen, thereafter by coating one or more than one insulator of metal oxide selected from the group consisting of $Al_2O_3$, TaO, TiO, ZrO, MgO, MoO, $SiO_z$, CuO, AgO and the like or semiconductors selected from the group consisting of $CaF_2$, $ZrF_2$, $AlF_3$, MgF and the other metal fluoride, then a direct reaction of the oxide superconductor 1 with the insulating film layer 3 is presented, and as a result, deterioration of the superconducting characteristic of the oxide superconductor can be prevented, so that it is very advantageous to construct a tunneling Josephson element in industry.

According to the method of the invention, it is possible to manufacture various superconductive devices composed of Josephson elements with the use of a high temperature oxide superconductor. An example is mentioned in detail. That is, the present invention is extremely useful for highly sensitive fluxmeter, analog applied machinery and tools such as EHF detector, superconductive high speed computer logic IC circuit, digital applied machinery and tools such as memory IC circuit.

Example (1) Object of Experiment

Recently, high temperature superconductors including Y-Ba-Cu-0 have been attracted attention, and active study has been made. The high temperature superconductor is naturally important to be utilized at high temperature in application, but viewed from electronic application, more particularly computer, it is rather important to recognize such property that an energy gap estimated from its high critical temperature (Tc) is large. That is, a Josephson circuit is operated by driving a flux quantum, but its driving capacity is propertionate to the output voltage of a driver, and the voltage is limited by a gap voltage. Therefore, if Josephson junction is materialized with a material having a large energy gap, the limitation due to such essential delay time can largely be mitigated.

Viewed from the above view point, the inventors have tried to form tunneling Josephson junction with the use of oxide superconductor. It is ideal to realize tunneling Josephson junctions in the form of a laminated thin film of oxide superconductor at the end, but at present, there is no technique of forming a thin film of oxide superconductor thin film of good quality, so that one oxide superconductor formed by sintering as one superconductor is experimented by using Niobium (Nb) as the other superconductor.

(2) Characteristic of LSCO/Al junction

First of all, an experiment was conducted by using an La Sr-Cu-O system oxide superconductor (hereinafter referred to as "LSCO"). A sintered body used is made by mixing a powder of $La_2(CO_3)_3$, $SrCO_3$, CuO in ethanol, reacting at 1,000° C. for 10 hours, pressing into pellets, and sintering at 1,000° C. for 6 hours. As a result of measurement by ICP method, the composition was La 1.58, Sr 0.22, $CuO_{4-x}$, on-set of the critical absolute temperature (Tc) was 45K, and the resistance become zero at 35K. The surface of sintered body was polished by using water and an $SiO_2$ powder before forming an element, a complete mirror face cannot be obtained because of the presence of cavity.

As a method of forming a tunnel barrier, the process for manufacturing Nb/Al tunnel junction was employed as it was, an aluminum film was formed on LSCO, and the surface was naturally oxidized to form an element as a trial. However, the thus obtained element shows remarkably high resistance, and is far from a Josephson element.

In order to find the cause of this high resistance, I-V characteristic of junction of LSCO and aluminum film was examined. The junction was formed by depositing aluminum (Al) on LSCO by resistance heating. The size of the junction was 600 μm square with the use of a metal mask. In order to obtain a contact of low resistance with LSCO, Au was deposited on the back side of a pellet.

FIG. 2 plots an example of the I-V characteristic of the thus obtained LSCO/Al junction at room temperature. That is, the current is proportionate to an index of a square root of a voltage. As a mechanism of electric conductivity showing such I-V characteristic, Schottky emission and Frenkel pool emission are known, and electric conductivity through an insulator thin film is shown.

$$I \propto \exp(e\sqrt{eV/(4 \cdot \pi \epsilon d)})/kT \quad (1)$$

and $$I \propto \exp(e\sqrt{eV/(\pi \epsilon d)})/kT \quad (2)$$

where, e is a charge mass, $\epsilon$ is a dielectric constant, d is a film thickness, k is a Boltzmann's factor, and T is an absolute temperature. The results of FIG. 2 more coinsides with (1) than (2).

FIG. 2 is a graph showing the I-V characteristic of La-Sr-Cu-O series oxide superconductor junction at room temperature, and in FIG. 2, a "+(Al)" curve shows an aluminum anode, and a "−(Al)" curve shows an aluminum cathode.

10 KHz of capacitance of junction was measured, and a value of about 1.1 nF was obtained, but no dependency upon the direct current bias voltage was observed. From this fact, it was found that there is existent no depletion layer.

considered from the above result, it is understood that there is formed a fairly thick insulating layer between LSCO and Al. When the inclination of the straight line and the value of the capacitance are used, a thickness d of the insulating layer and a specific dielectric constant $\epsilon_r$ can be assumed, and on the assumption of (1), d = 25 nm, and $\epsilon_r = 7.5$.

(3) Characteristic of YBCO/Al junction

Next, an experiment was conducted by using Y-Ba-Cu-O oxide sintered body (hereinafter referred to as "YBCO"). An YBCO sintered body was formed by mixing powder of $Y_2O_3$, $BaCO_3$ and CuO in ethanol, reacting the mixture at 900° C for 12 hours, and further sintering it at 950° C. for 72 hours. The composition ratio of Y, Ba and Cu is 1:2:3. As a result of measuring resistance, the resistance of this specimen became zero at absolute temperature of 83K. Before forming an oxide superconductor device, the specimen surface is polished with $Al_2O_3$ of 0.2 μm in grain diameter. The specimen surface after polishing became a mirror surface having comparatively less depletion.

On the polished YBCO was deposited aluminum (Al) by resistance heating, and contact junction was formed. A junction area was made 800 μm × 1,200 μm by metal mask. Further, at the rear surface of the specimen was formed at ohmic contact with the use of gold (Au). FIG. 3 is a graph showing the I-V characteristic of the obtained junction at room temperature (T = 296K). The case of making the Al side pulse (+) and the case of making it minus (−) show substantially symmetrical characteristics, and the resistance in the vicinity of the starting point became about 40 Ω. Further, a bend is observed in I-V characteristic, and it is estimated that an insulating layer is formed on the YBCO/Al interface.

Next, the temperature change of I-V characteristic was measured. In FIG. 4 is shown the result. FIG. 4 is a diagram showing temperature dependency of current of YBCO/Al junction. In FIG. 4, there is no temperature change at less than about 50K, and within this temperature range a current is considered to flow through the insulating film in tunneling mechanism. Resistance at around the starting point in this time became about 200 Ω.

(4) Trial manufacture of YBCO/Au/AlO$_x$/Nb tunneling Josephson element

As stated above, the YBCO/Al contact becomes highly resistive due to formation of the insulating layer on the interface between YBCO and Al. Therefore, the prior technique of forming Nb/Al/AlO$_x$ junction cannot be used as it is. Hence, the inventors paid attention to that the YBCO/Au contact is ohmic, and manufactured a tunneling Josephson element of YBCO/Au/AlO$_x$/Nb structure by preventing a reaction of Al with YBCO by a method of depositing Au thinly before deposition of Al.

FIG. 5 a–d shows a manufacturing process. First of all, Au (2) is deposited on both of the polished surfaces of an YBCO sintered body (1). Au in the rear is used as an ohmic electrode. A film thickness of Au deposited on the surface is 7 nm.

Next, in another vacuum chamber, Al (3) and Nb are successively deposited by an electron beam deposition method. Film thicknesses are 6 nm and 100 nm, respectively. Before depositing Nb, the surface of Al is oxidized in pure oxide having pressure of 3 torr for 30 minutes, and an oxidizing film $(Al_2O_3)_3$ is obtained. Finally, the obtained resist 5 at the junction portion is patterning and Nb (4) of the upper electrode is etching by RIE with the use of $CF_4$ gas including 5% of oxygen $(O_2)$. The junction area is 800 μm × 800 μm.

FIG. 6(a) is a graph showing current-voltage characteristic measured by a 4 terminal method bonding the formed junction with the use of Indium (In). FIG. 6(b) is I-V characteristic of tunneling junction of YBCO/Au/AlO$_x$/Nb at an absolute temperature of 4.2K, and the junction area is 800×800 μm$^2$. FIG. 6(a) is an observation view of the superconductive current, in which the critical current density is J=7×10$^{31}$$^3$A/cm$^2$, the scale of coordinate is 100 μA/div, and the scale of abscissa is 100 μV/div. The measured temperature is 4.2K. The superconducting current of 50 μA is observed in the vicinity of the starting point. On the assumption that a uniform current is flowed to the whole junction, the superconducting current density becomes about 0.007A/cm$^2$. Further, hysteresis characteristic to tunneling junction is observed. This histeresis is not observed in point contact junction with the use of the prior oxide superconductor.

However, the leak current of less than gap voltage is very large, the I-V characteristic is shown a slightly projected bend below, and a clear gap structure cannot be observed. It is considered that flatness of the polished YBCO surface is not good, and a barrier layer is not uniformly formed. Therefore, the possibility of existing many point junctions in parallel to tunneling junction cannot be denied.

Figure 7:
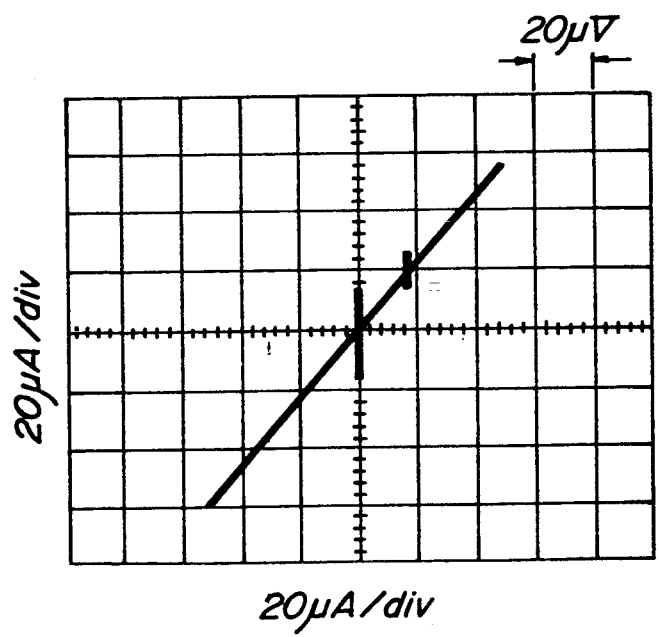
FIG. 7 is a characteristic view showing a dielectric voltage step on the I-V characteristic line of YBCO/Au/AlO$_x$/Nb junction according to the invention.

Next, FIG. 7 shows I-V characteristic diagram when microwave is irradiated to the element. FIG. 7 shows a high frequency dielectric voltage step on the I-V characteristic line of YBCO/Au/AlO$_x$/Nb tunneling junction. Coordinate is 20 μA/div, and abscissa is 20 μA/div. Frequency of the irradiated microwave is 8.3 GHz. Shappiro step was observed on the I-V characteristic. The relation between the constant voltage step V step and the frequency f of the irradiated microwave satisfies the following equation (3).

$$V_{step} = n\,(h/2e)f \quad (3)$$

where, n is an integer, h is a blank constant, and e is a charge mass. It was confirmed from the above that this junction becomes Josephson junction by tunneling of bare electron.

(5) Conclusion

From the standpoint of view that large energy gap of the oxide superconductor having high critical temperature is important for improving driving capacity of the Josephson circuit, the inventors tried to form tunneling Josephson junction on the surface of an oxide superconductor of a sintered body. Hitherto, in order to find the possibility of replacing the lower electrode of Nb/Al-/AlO$_x$/Nb junction of high quality with the use of Nb for oxide superconductor, LSCO/Al, YBCO/Al contact was examined in the first place, and as a result, it was found that a fairly thick insulating layer is formed at the interface between LSCO and Al. From the measurement result of I-V characteristic and C-V characteristic, it is assumed that the thickness of the insulating layer is d=25 nm, and the specific dielectric constant is $\epsilon_r$=7.5. There was further obtained an experimental result suggesting the formation of an insulating layer on the YBCO/Al interface. In order to prevent the formation of the above insulating layer on the interface between oxide superconductor and Al, a tunneling Josephson element of YBCO/Au/AlO$_x$/Nb structure was manufactured for trial by using a method of coating the surface of oxide superconductor with thin gold film (Au), and superconducting current and hysteresis were observed on I-V characteristic curve. Josephson junction by tunneling of bare electron was also confirmed by observing the constant voltage step at the time of irradiating microwave. However, a large leak current is existent in the thus obtained junction. This is because of bad flatness of the surface of the sintered body, and the possibility of existing point-like junction other than tunneling junction cannot be denied.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A superconductive device having a tunneling Josephson element comprising:
a first oxide superconductor electrode, a blocking layer consisting of metal substantially inert to oxygen formed on the surface of the oxide superconductor, an insulating thin film layer formed on the blocking layer, and a second metallic superconductor electrode opposing said first electrode formed on the insulating thin film, wherein the blocking layer has a thickness of from about 10 to 100 angstroms and the insulating film has a thickness of from about 10 to 100 angstroms.

2. A superconductor device as in claim 1, wherein the insulating thin film layer is selected from the group consisting of aluminum oxide, tantalum oxide, titanium oxide, zirconium oxide, magnesium oxide, molybdenum oxide, silicon oxide, copper oxide, silver oxide, calcium fluoride, zirconium fluoride, aluminum fluoride, magnesium fluoride, silicon and germanium.

3. A superconductive device as in claim 1, wherein the blocking layer is selected from the group consisting of Au, Pt, Ag and Cu.

* * * * *